(12) United States Patent
Cho et al.

(10) Patent No.: US 9,646,956 B2
(45) Date of Patent: May 9, 2017

(54) LIGHT EMITTING DEVICE PACKAGE

(71) Applicant: LG INNOTEK CO., LTD., Seoul (KR)

(72) Inventors: Bum Chul Cho, Seoul (KR); Moon Sub Kim, Seoul (KR); Jin Kwan Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/712,641

(22) Filed: May 14, 2015

(65) Prior Publication Data

US 2015/0249074 A1 Sep. 3, 2015

Related U.S. Application Data

(63) Continuation of application No. 13/838,721, filed on Mar. 15, 2013, now Pat. No. 9,064,773.

(30) Foreign Application Priority Data

Oct. 26, 2012 (KR) .................. 10-2012-0119535
Oct. 26, 2012 (KR) .................. 10-2012-0119536

(51) Int. Cl.
*H01L 25/16* (2006.01)
*H01L 27/15* (2006.01)
*H01L 31/167* (2006.01)

(52) U.S. Cl.
CPC ............ *H01L 25/167* (2013.01); *H01L 27/15* (2013.01); *H01L 31/167* (2013.01); *H01L 2224/32245* (2013.01); *H01L 2224/48091* (2013.01); *H01L 2224/48247* (2013.01); *H01L 2224/73265* (2013.01)

(58) Field of Classification Search
None
See application file for complete search history.

(56) References Cited

U.S. PATENT DOCUMENTS

| 4,001,859 A | 1/1977 | Miyoshi et al. |
| 4,040,078 A | 8/1977 | Eckton, Jr. et al. |
| 4,268,843 A | 5/1981 | Brown et al. |

(Continued)

FOREIGN PATENT DOCUMENTS

| CN | 101926002 A | 12/2010 |
| WO | WO 2007/116342 A1 | 10/2007 |

(Continued)

*Primary Examiner* — Eva Y Montalvo
*Assistant Examiner* — Kevin Quinto
(74) *Attorney, Agent, or Firm* — Birch, Stewart, Kolasch & Birch, LLP

(57) ABSTRACT

Embodiments provide a light emitting device package including a package body having a top-opened cavity disposed in at least a portion thereof, a first electrode layer and a second electrode layer electrically isolated from the package body with an insulating layer interposed therebetween, the first electrode layer and the second electrode layer being electrically isolated from each other at a bottom surface of the cavity, a light emitting device placed on the bottom surface of the cavity configured to emit light through the open region of the cavity, and a sensor placed on at least a portion of the package body at the outside of the cavity configured to measure output of the light emitting device.

19 Claims, 15 Drawing Sheets

(56) References Cited

U.S. PATENT DOCUMENTS

| | | | |
|---|---|---|---|
| 5,361,634 A * | 11/1994 | Uramachi | H01C 7/027 |
| | | | 73/204.18 |
| 5,406,543 A | 4/1995 | Kobayashi et al. | |
| 5,463,229 A | 10/1995 | Takase et al. | |
| 5,535,231 A | 7/1996 | Lee et al. | |
| 5,647,034 A | 7/1997 | Matsuda et al. | |
| 5,777,390 A | 7/1998 | Berger et al. | |
| 7,456,434 B2 | 11/2008 | Kim et al. | |
| 7,491,978 B2 | 2/2009 | Zakgeym et al. | |
| 7,491,980 B2 | 2/2009 | Higaki et al. | |
| 7,884,378 B1 | 2/2011 | Lu et al. | |
| 7,928,458 B2 | 4/2011 | Lin et al. | |
| 2003/0020059 A1* | 1/2003 | Komoda et al. | 257/10 |
| 2006/0001055 A1* | 1/2006 | Ueno | H01L 33/60 |
| | | | 257/257 |
| 2007/0170449 A1 | 7/2007 | Anandan | |
| 2007/0262408 A1* | 11/2007 | Takagi et al. | 257/467 |
| 2008/0290353 A1* | 11/2008 | Medendorp, Jr. | H01L 25/167 |
| | | | 257/89 |
| 2009/0057687 A1* | 3/2009 | Wang | F21K 9/00 |
| | | | 257/82 |
| 2009/0065768 A1* | 3/2009 | Nomura et al. | 257/40 |
| 2009/0156913 A1 | 6/2009 | MacNeish, III et al. | |
| 2009/0302329 A1 | 12/2009 | Noma et al. | |
| 2010/0078668 A1 | 4/2010 | Kim | |
| 2013/0207127 A1 | 8/2013 | Yu et al. | |

FOREIGN PATENT DOCUMENTS

| | | |
|---|---|---|
| WO | WO 2009/095860 A1 | 8/2009 |
| WO | WO 2010/036066 A2 | 4/2010 |
| WO | WO 2010/099647 A1 | 9/2010 |

* cited by examiner

LIGHT EMITTING DEVICE PACKAGE

CROSS REFERENCE TO RELATED APPLICATION

This application is a continuation of application Ser. No. 13/838,721, filed Mar. 15, 2013, which claims priority under 35 U.S.C. §119 to Korean Patent Application No. 10-2012-0119535, filed in Korea on Oct. 26, 2012 and No. 10-2012-0119536, filed in Korea on Oct. 26, 2012, which are hereby incorporated in its entirety by reference as if fully set forth herein.

TECHNICAL FIELD

Embodiments relate to light emitting device packages.

BACKGROUND

Light emitting devices, such as Light Emitting Diodes (LEDs) or Laser Diodes (LDs), which use group III-V or group II-VI compound semiconductors, are capable of emitting light of various colors, such as red, green, blue, and ultraviolet light and the like, owing to developments of device materials and thin film growth technologies. Moreover, these light emitting devices are capable of emitting white light with high efficiency through use of a fluorescent substance or color combination, and have advantages of low power consumption, semi-permanent lifespan, fast response time, safety and environmental friendliness as compared to conventional light sources, such as fluorescent lamps, incandescent lamps and the like.

Accordingly, application sectors of light emitting devices are expanded up to transmitting modules of optical communication means, LED backlights to replace Cold Cathode Fluorescence Lamps (CCFLs) which serve as backlights of Liquid Crystal Display (LCD) apparatuses, white LED lighting apparatuses to replace fluorescent lamps or incandescent lamps, head lights of vehicles and traffic lights.

FIG. 1 is a view illustrating a conventional light emitting device package.

The light emitting device package 100 may include a package body 110 having a cavity, and a light emitting device 10 placed at a bottom surface of the cavity. A radiator (not shown) may be located below the package body 110.

A first lead frame 121 and a second lead frame 122 may be placed on the package body 110. The first and second lead frames 121 and 122 may extend to the bottom surface of the cavity so as to be partially placed at the bottom surface and may be electrically connected to the light emitting device 10.

The light emitting device 10 may be electrically connected to the first lead frame 121 via a conductive adhesive 130, and may be electrically connected to the second lead frame 122 via a wire 140.

The cavity is filled with a molding part 160 containing a fluorescent substance 150 to protect the light emitting device 10 and the wire 140, for example. The fluorescent substance 150 is excited by a first wavelength range of light emitted from the light emitting device 10, thereby emitting a second wavelength range of light.

However, the conventional light emitting device package has the following problems.

The light emitting device emits heat as well as the above-described first wavelength range of light, which may have a negative effect on driving of the light emitting device. In addition, light emitting devices fabricated according to the same specifications may vary slightly in terms of thermal emission. Conventionally, the light emitting device may exhibit an increase in temperature to a range of about 60~80° C. during driving thereof, and as necessary, the temperature of the light emitting device package must be adjusted according to external environment, such as the brightness of a place where the light emitting device package is located. Accordingly, it is necessary to adjust the temperature of the light emitting device package by measuring heat at or around the light emitting device.

Further, the quantity of light emitted from the light emitting device may vary according to applied voltage, the composition of the light emitting device, or the like, and even light emitting devices fabricated according to the same specifications may vary slightly in terms of light emission. As necessary, the quantity of light of the light emitting device package must be adjusted according to external environment, such as the brightness of a place where the light emitting device package is located.

Accordingly, it is necessary to adjust the quantity of light of the light emitting device package by measuring the quantity of light at or around the light emitting device.

SUMMARY

Embodiments provide a light emitting device package in which the quantity of heat discharged from a light emitting device is adjusted by sensing temperature/heat at or around the light emitting device.

Further, embodiments provide a light emitting device package in which the quantity of light may be adjusted by measuring the quantity of light at or around the light emitting device.

In one embodiment, a light emitting device package includes a package body having a top-opened cavity disposed in at least a portion thereof, a first electrode layer and a second electrode layer electrically isolated from the package body with an insulating layer interposed therebetween, the first electrode layer and the second electrode layer being electrically isolated from each other at a bottom surface of the cavity, a light emitting device placed on the bottom surface of the cavity to emit light through the open region of the cavity, and a sensor placed on at least a portion of the package body at the outside of the cavity to measure output of the light emitting device.

The sensor may be a thermo sensor to measure a temperature of the light emitting device.

The thermo sensor may include a heat sensing portion and an electrode pad.

The heat sensing portion and the electrode pad may come into contact with each other with a heat transfer portion interposed therebetween.

The heat transfer portion may comprise titanium (Ti), and a thickness of the heat transfer portion may be within a range of 25 nm to 100 nm.

The heat sensing portion may comprise nickel (Ni), and a thickness of the heat sensing portion may be within a range of 100 nm to 500 nm.

The electrode pad may comprise aluminum (Al), and a thickness of the electrode pad may be within a range of 100 nm to 500 nm.

A size of the thermo sensor may be within a range of 0.3 µm to 1 µm.

The sensor may be a photo sensor to measure the strength of light emitted from the light emitting device, and the photo sensor may be integrated with the package body.

The cavity may be at least a partial depressed portion of the package body, the package body may include a raised portion around the open region of the cavity, and the photo sensor may be placed on the raised portion.

The photo sensor may include a photo sensor body, a first insulating film and a second insulating film placed on a first surface and a second surface of the photo sensor body, and an electrode layer.

The photo sensor body may comprise polycrystalline silicon, and a thickness of the photo sensor body may be within a range of 0.5 μm to 5 μm.

At least one of the first insulating film or the second insulating film may comprise $Si_3N_4$, and a thickness of the insulating film may be within a range of 30 nm to 100 nm.

The photo sensor may further include a light sensing portion to electrically connect the photo sensor body and the electrode layer to each other.

The electrode layer may be arranged as a plurality of facing lines.

The photo sensor may include a first area coming into contact with the package body, and a second area facing the bottom surface of the cavity.

The electrode layer may be arranged as a plurality of parallel facing lines in the second area of the photo sensor.

The photo sensor may take the form of a cantilever, a part of which is secured to the raised portion and another part of which is exposed to the cavity.

In another embodiment, a light emitting device package includes a package body having a top-opened cavity disposed in at least a portion thereof and a raised portion around the open region of the cavity, a first electrode layer and a second electrode layer electrically isolated from the package body with an insulating layer interposed therebetween, the first electrode layer and the second electrode layer being electrically isolated from each other at the bottom surface of the cavity, a light emitting device placed on the bottom surface of the cavity to emit light through the open region of the cavity, and a semiconductor layer placed on the raised portion.

In a further embodiment, a light emitting device package includes a package body having a top-opened cavity disposed in at least a portion thereof, the package body comprises silicon, a first electrode layer and a second electrode layer electrically isolated from the package body with an insulating layer interposed therebetween, the first electrode layer and the second electrode layer being electrically isolated from each other at the bottom surface of the cavity, a nitride-based light emitting device placed on the bottom surface of the cavity to emit light through the open region of the cavity, and a thermo sensor placed on the package body around the open region of the cavity.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
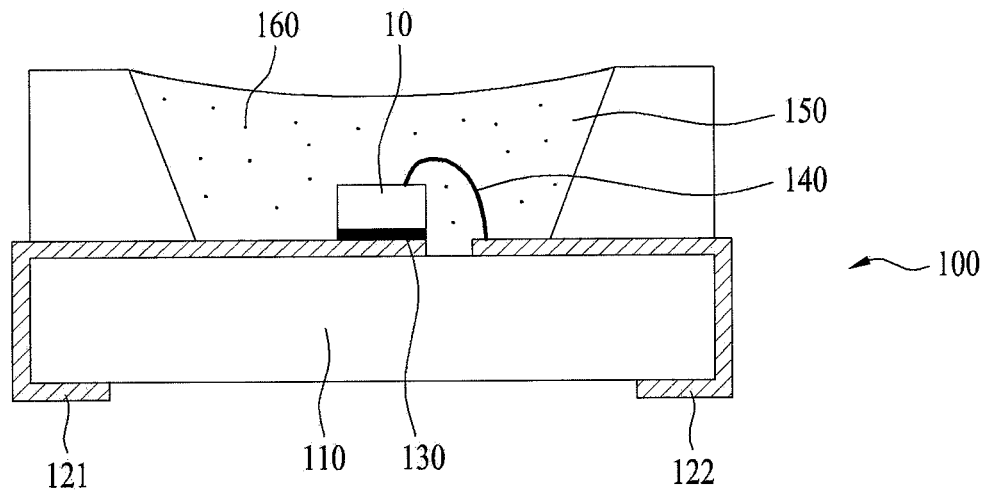
FIG. 1 is a view illustrating a conventional light emitting device package.

Hereinafter, embodiments will be described with reference to the annexed drawings.

Prior to description of the embodiments, it will be understood that, when each element, such as a layer (film), region, pattern or structure is referred to as being formed "on" or "under" the other element, such as a substrate, layer (film), region, pad or pattern, it can be directly "on" or "under" the other element or be indirectly formed with intervening one or more other elements therebetween. Also, it will also be understood that "on" or "under" the element may be described relative to the drawings.

In the drawings, the thickness or size of each layer may be exaggerated, omitted or schematically illustrated for clarity and convenience. In addition, the size of each constituent element does not wholly reflect an actual size thereof.

Figure 2:
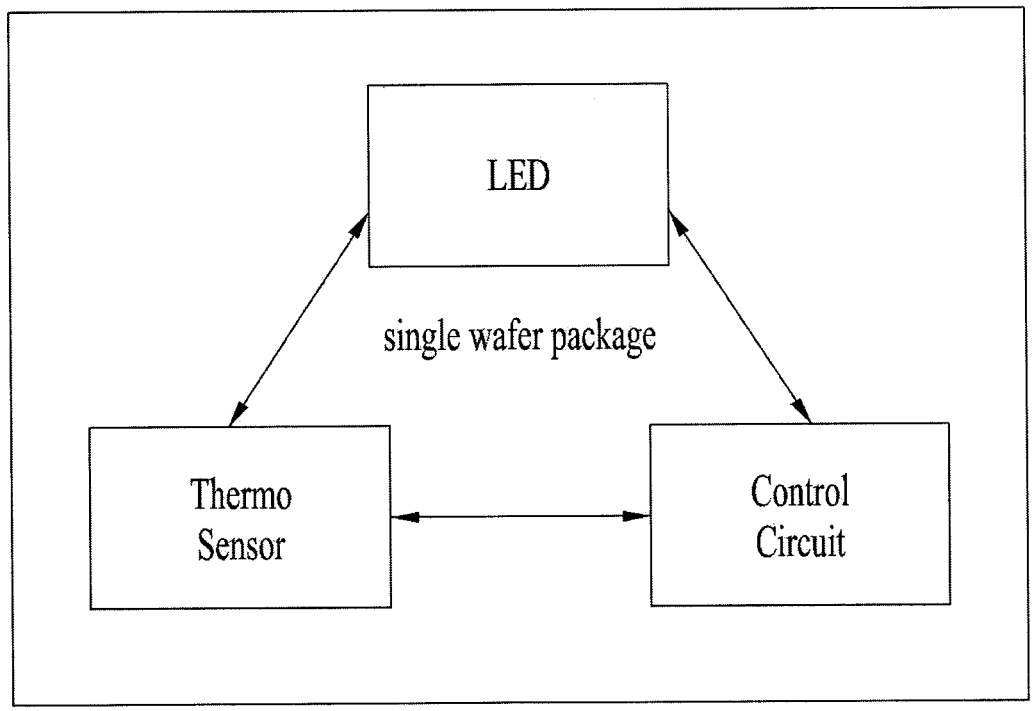
FIG. 2 is a block diagram illustrating a configuration of an embodiment of a light emitting device package.

FIG. 2 is a block diagram illustrating a configuration of an embodiment of a light emitting device package.

The light emitting device package according to an embodiment may be configured such that a light emitting device, a thermo sensor and a control circuit are arranged within a package. Here, the package is fabricated using a single wafer, and the thermo sensor is integrated with the wafer. By integrating the thermo sensor with the wafer that forms a package body, it is possible to reduce manufacturing cost and time.

Figure 3A:
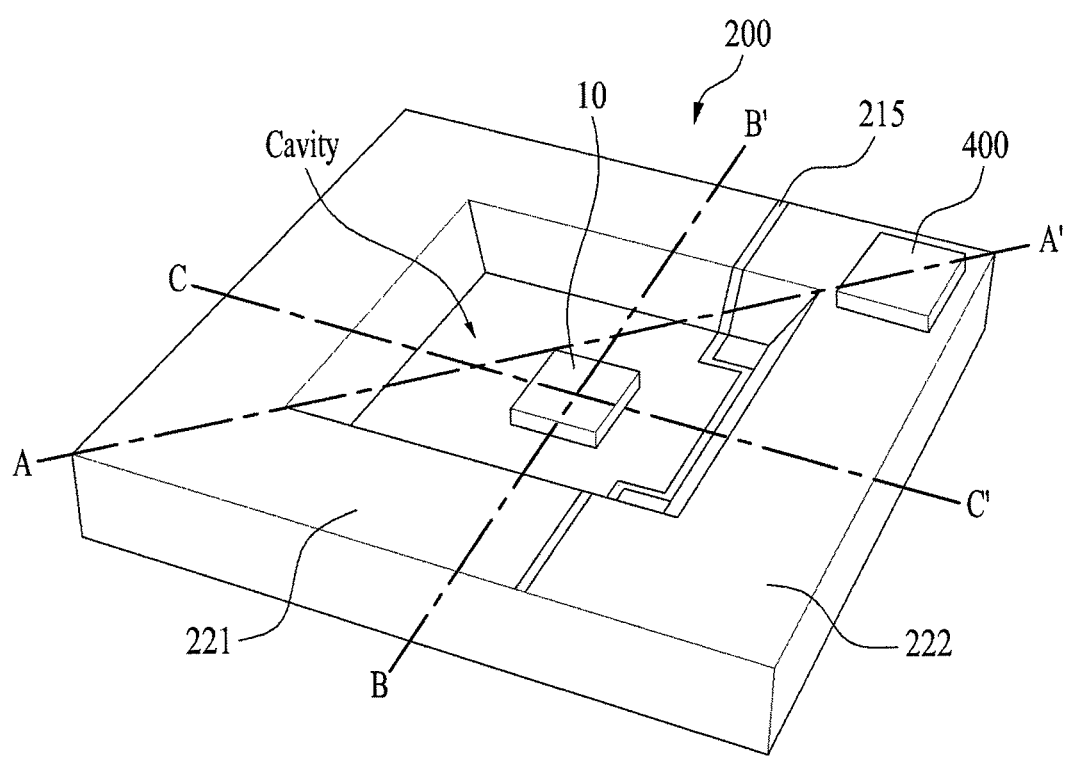
FIGS. 3A and 3B are views illustrating an embodiment of a light emitting device package.
Figure 3B:
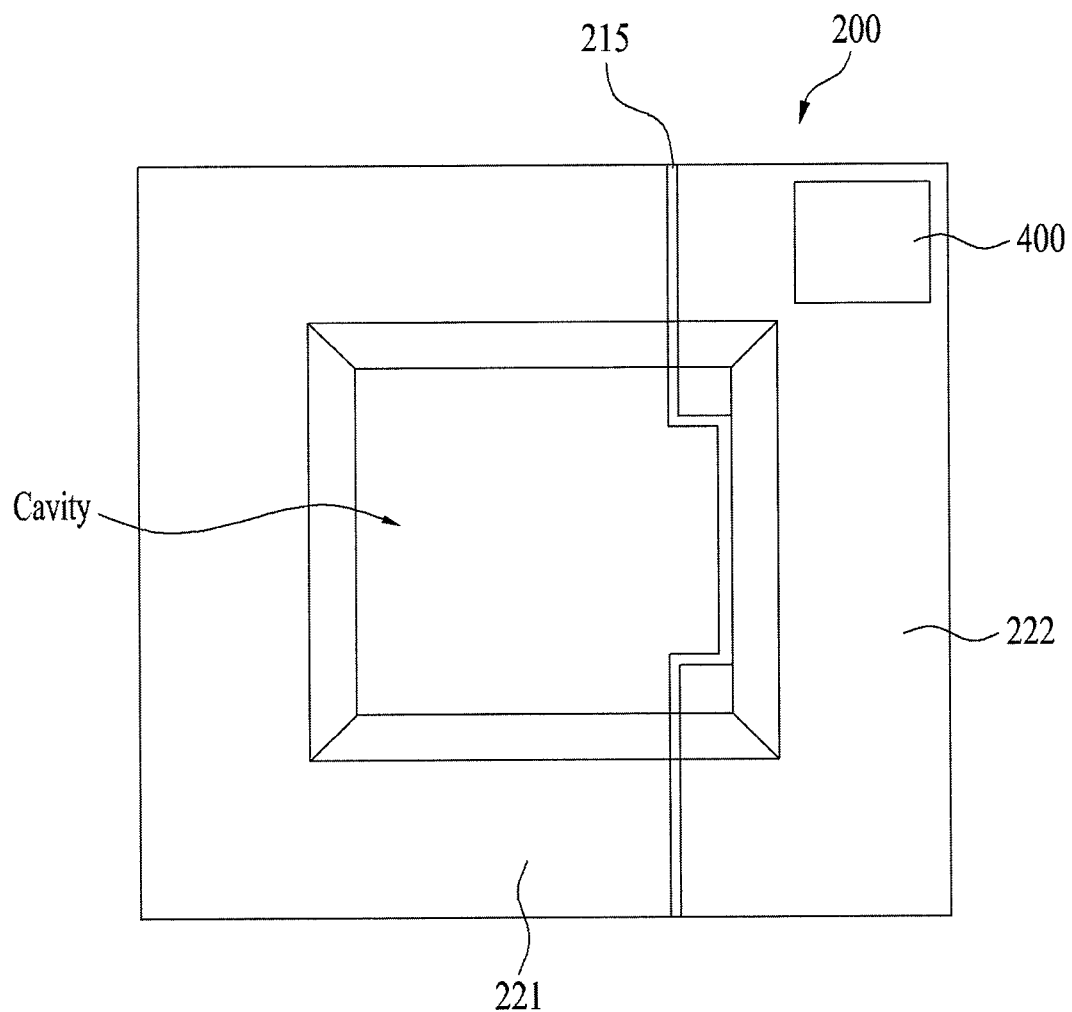
Figure 4A:
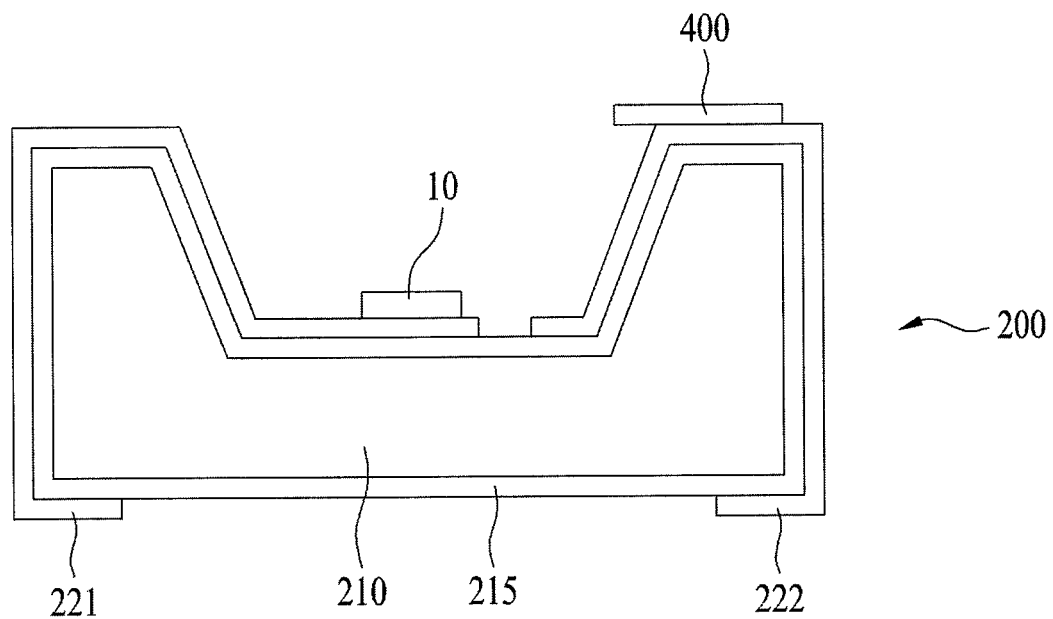
FIGS. 4A to 4C are sectional views respectively taken along the line A-A', the line B-B', and the line C-C' of FIG. 3A.
Figure 4B:
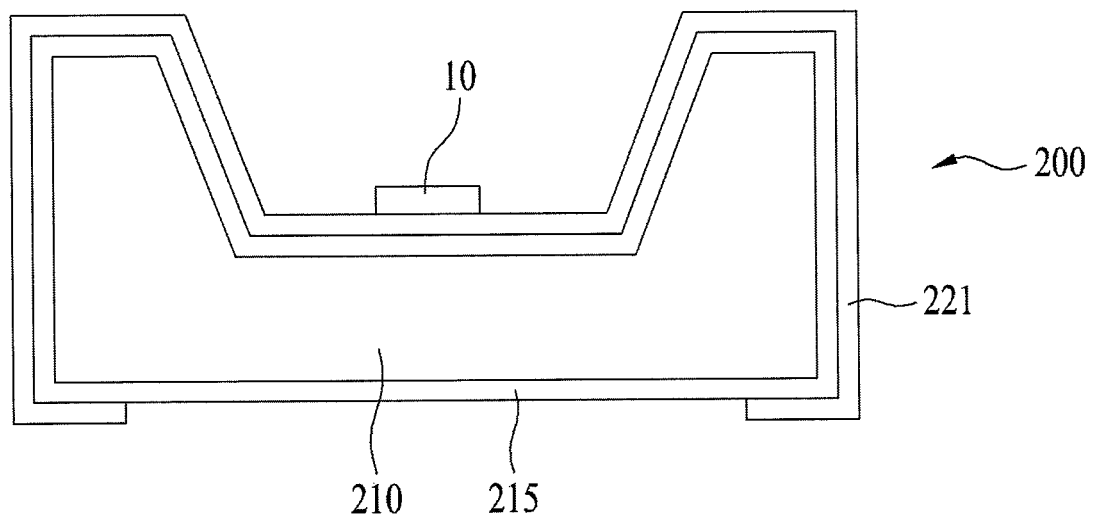
Figure 4C:
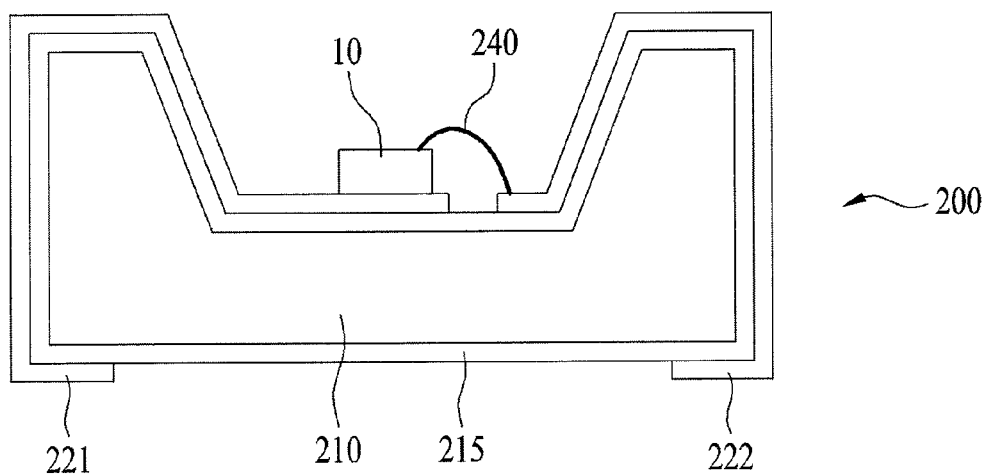

FIGS. 3A and 3B are views illustrating an embodiment of a light emitting device package, and FIGS. 4A to 4C are sectional views respectively taken along the line A-A', the line B-B', and the line C-C' of FIG. 3A. Hereinafter, an embodiment of a light emitting device package will be described with reference to FIGS. 3A to 4C.

As illustrated, the light emitting device package, designated by reference numeral 200, according to an embodiment includes a package body 210 on which a light emitting device 10 and a thermo sensor 400 are placed. The package body 210 may be fabricated using a silicon wafer, and a cavity having an open top may be disposed in a portion of the package body 210.

The cavity may be disposed by etching the silicon wafer that forms the package body 210 after the thermo sensor 400 is deposited or formed on the silicon wafer. Although not illustrated, a molding part may be disposed within the cavity using a resin containing a fluorescent substance, etc., to protect a light emitting device and a wire, for example. The fluorescent substance is excited by a first wavelength range of light emitted from the light emitting device, thereby emitting a second wavelength range of light.

Although the package body 210 is illustrated as having a cuboidal shape, the package body 210 may have an arbitrary polyhedral shape.

More specifically, a central region of the package body 210 may be depressed to form the cavity, and the light emitting device 10 may be placed at a bottom surface of the cavity. The cavity may be defined by the bottom surface and sidewalls disposed on the bottom surface, and a portion of the package body 210 around the cavity may be relatively raised. The thermo sensor 400 may be placed on the raised portion.

The cavity may have, for example, a polygonal, circular, or oval cross section, in addition to an illustrated shape, and the area of the top of the cavity may be greater than the area of the bottom surface. The cavity may be disposed by performing dry etching or wet etching on the package body 210, or by other processes.

An insulating layer 215 may be disposed to surround the package body 210. In the case in which the package body 210 is formed of a semiconductor material, such as silicon, etc., the insulating layer 215 may electrically insulate the package body 210 from the light emitting device 10, the thermo sensor 400, or first and second electrode layers 221 and 222.

The insulating layer 215 may be formed of an insulating material, such as silicon oxide ($SiO_2$), silicon nitride ($Si_3N_4$), aluminum nitride (AlN), or silicon carbide (SiC).

The light emitting device 10 may include a Light Emitting Diode (LED). The LED may be a blue light emitting diode or an ultraviolet or deep-ultraviolet emitting diode as needed. In addition, a horizontal type light emitting device, a vertical type light emitting device, or a flip-chip type light emitting device may be used according to shape or electrode arrangement. As necessary, two or more light emitting devices may be arranged.

If the light emitting device 10 is an LED, the light emitting device 10 may include a light emitting structure consisting of a first conductive semiconductor layer, an active layer, and a second conductive semiconductor layer.

The first conductive semiconductor layer may be formed of a semiconductor compound, for example, group III-V or group II-VI compound semiconductors. Additionally, a first conductive dopant may be doped. If the first conductive semiconductor layer is an n-type semiconductor layer, the first conductive dopant is an n-type dopant including Si, Ge, Sn, Se and Te, although the disclosure is not limited thereto. The first conductive semiconductor layer may be provided alone or along with an undoped semiconductor layer therebelow, although the disclosure is not limited thereto.

The undoped semiconductor layer serves to improve crystallization of the first conductive semiconductor layer. The undoped semiconductor layer may be equal to the first conductive semiconductor layer, except for the fact that the undoped semiconductor layer is not doped with the n-type dopant, and thus has less electric conductivity than the first conductive semiconductor layer.

The active layer may be disposed on the first conductive semiconductor layer. The active layer serves to emit light having energy determined by an intrinsic energy-band of a constituent material thereof (i.e. a light emitting material) via combination of electrons introduced through the first conductive semiconductor layer and holes introduced through the second conductive semiconductor layer that will be formed later.

The active layer may have at least any one of a double hetero junction structure, a single well structure, a multiple well structure, a quantum-wire structure, or a quantum-dot structure. For example, the active layer may have a multiple quantum well structure via injection of trimethylgallium gas (TMGa), ammonia gas ($NH_3$), nitrogen gas ($N_2$), and trimethylindium gas (TMIn), although the disclosure is not limited thereto.

The active layer may include a well layer and a barrier layer, which have at least one pair configuration of InGaN/GaN, InGaN/InGaN, GaN/AlGaN, InAlGaN/GaN, GaAs (InGaAs)/AlGaAs, and GaP(InGaP)/AlGaP, for example, although the disclosure is not limited thereto. The well layer may be formed of a material having a smaller band gap than that of the barrier layer.

A conductive clad layer (not shown) may be disposed on and/or under the active layer. The conductive clad layer may be formed of a semiconductor having a greater band gap than that of the barrier layer of the active layer. For example, the conductive clad layer may include GaN, AlGaN, InAlGaN, or super-lattice structure. Additionally, the conductive clad layer may be an n-type or p-type doped layer.

The second conductive semiconductor layer may be disposed on the active layer. The second conductive semiconductor layer may be formed of a semiconductor compound, for example, group III-V compound semiconductors doped with a second conductive dopant. The second conductive semiconductor layer may include, for example, a semiconductor material having a composition equation of $In_xAl_yGa_{1-x-y}N$ ($0 \le x \le 1$, $0 \le y \le 1$, $0 \le x+y \le 1$). If the second conductive semiconductor layer is a p-type semiconductor layer, the second conductive dopant is a p-type dopant including Mg, Zn, Ca, Sr, Ba, etc., although the disclosure is not limited thereto.

Alternatively, differently from the above description, the first conductive semiconductor layer may include a p-type semiconductor layer, and the second conductive semiconductor layer may include an n-type semiconductor layer. Additionally, a third conductive semiconductor layer including an n-type or p-type semiconductor layer may be disposed on the first conductive semiconductor layer. As such, the above-described light emitting device may include at least any one of n-p, p-n, n-p-n, p-n-p junction structures.

The light emitting device 10 may be placed at the bottom surface of the cavity, and may be electrically connected to the first electrode layer 221 and the second electrode layer 222. In the present embodiment, the light emitting device 10 may be electrically connected to the first electrode layer 221 via a conductive adhesive (not shown), and may be electrically connected to the second electrode layer 222 via a wire 240.

The first electrode layer 221 and the second electrode layer 222 may be formed of a conductive material, more particularly, a metal or conductive alloy, for example. More specifically, the first electrode layer 221 and the second electrode layer 222 may be formed of copper (Cu), aluminum (Al), or silver (Ag). The first electrode layer 221 and the second electrode layer 222 may be electrically isolated from the package body 210 with the insulating layer 215 interposed therebetween. As illustrated, the first electrode layer 221 and the second electrode layer 222 may be electrically isolated from a lower surface of the package body 210 and the bottom surface of the cavity.

The first electrode layer 221 and the second electrode layer 222 may have a multi-layer form, instead of a single-layer form as illustrated. When the illustrated light emitting device package is mounted on, for example, a circuit board via a Surface Mount Technology (SMT) process, the first electrode layer 221 and the second electrode layer 222 may be electrically or mechanically coupled to the wiring of the board.

The thermo sensor 400 may be any one of a thermal conductor, a semiconductor junction measurement device, and a metal-semiconductor junction measurement device.

The thermo sensor 400, as described above, may be placed on the raised portion of the package body 210. The thermo sensor 400 may serve not only to measure heat emitted from the light emitting device 10 or a temperature of the light emitting device package 200, but also to measure the quantity of light of a place where the light emitting device package 200 is located. The thermo sensor 400 may be integrated with the package body 210 fabricated using a silicon wafer during a growth process of the package body 210. Specifically, the thermo sensor 400 may be placed on the package body 210 with the insulating layer 215 interposed therebetween.

Figure 5:
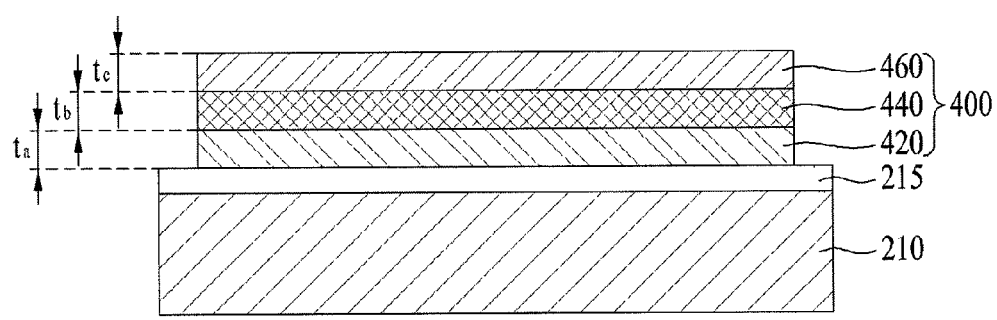
FIG. 5 is a view illustrating a thermo sensor of FIG. 3A in detail.

FIG. 5 is a view illustrating the thermo sensor of FIG. 3A in detail.

The thermo sensor 400 may be integrated with the package body 210 during fabrication of the package body 210. More specifically, the thermo sensor 400 may be placed on the package body 200 with the insulating layer 215 interposed therebetween. The thermo sensor 400 may include a heat sensing portion 420, an electrode pad 460, and a heat transfer portion 440 located between the heat sensing portion 420 and the electrode pad 460.

The thermo sensor 400 may have a size within a range of 0.3 μm to 1 μm. Considering the fact that the raised portion of the package body 210 has a width of about 1 μm, the thermo sensor 400 may be sufficiently placed on the raised portion. If the size of the thermo sensor 400 exceeds 1 μm, it may be impossible to place the thermo sensor 400 on the package body 210. If the size of the thermo sensor 400 is less than 0.3 μm, the thermo sensor 400 may have difficulty in sensing heat.

The heat sensing portion 420 may be formed of nickel (Ni), and a thickness $t_a$ of the heat sensing portion 420 may be within a range of 100 nm to 500 nm. An excessively small thickness of the heat sensing portion 420 may cause insufficient heat sensing, and an excessively great thickness of the heat sensing portion 420 may increase manufacturing cost and time. The resistance of Nickel varies with temperature and, thus, Nickel may be used to form the heat sensing portion 420, or other materials may be used so long as the resistance thereof varies with temperature.

The electrode pad 460 may be formed of a conductive material, for example, aluminum (Al), and a thickness of the electrode pad 460 may be within a range of 100 nm to 500 nm. An excessively small thickness of the electrode pad 460 may cause incorrect supply of current to the heat sensing portion 420, and an excessively great thickness of the electrode pad 460 may increase manufacturing cost and time, or may cause considerable light reflection.

The heat transfer portion 440 may be formed of a high thermal-conductivity material, such as titanium (Ti), and a thickness of the heat transfer portion 440 may be within a range of 25 nm to 100 nm. The heat transfer portion 440 may be advantageous with regard to heat dissipation, but may act as a heat source because it absorbs heat if it has an excessively great thickness, and may cause deterioration in contact between the electrode pad 460 and the heat sensing portion 420 if it has an excessively small thickness.

When a voltage is applied to at least two points of the above-described electrode pad 460, the heat sensing portion 420 senses heat of the surroundings, thereby measuring a temperature of the light emitting device or an internal temperature of the light emitting device package.

The heat sensing portion and the electrode pad of the thermo sensor may be formed of the same materials as those of a light sensing portion and an electrode pad of a photo sensor that will be described hereinafter, and may be fabricated via the same process as the photo sensor. Thus, if constituent materials of the light sensing portion and the electrode pad of the photo sensor are changed, likewise, constituent materials of the heat sensing portion and the electrode pad may be replaced by the constituent materials of the light sensing portion and the electrode pad of the photo sensor.

Figure 6A:
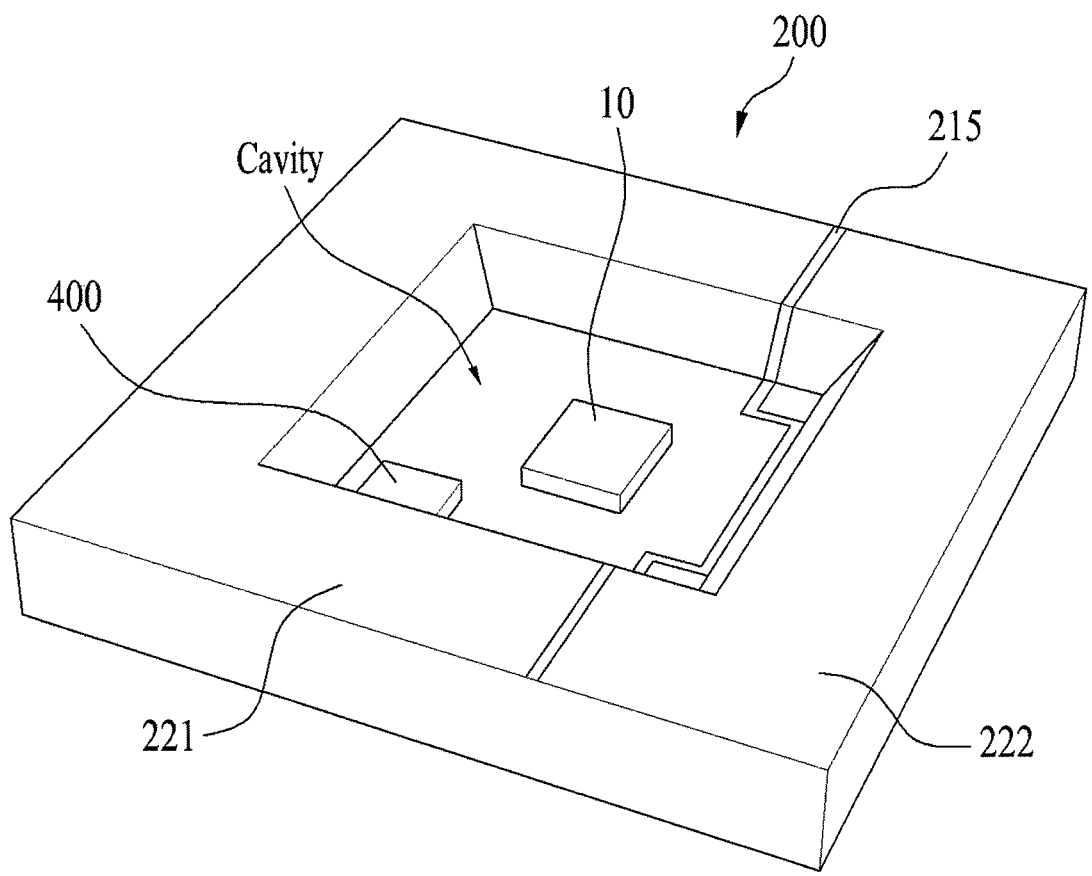
FIGS. 6A and 6B are views illustrating another embodiment of a light emitting device package.
Figure 6B:
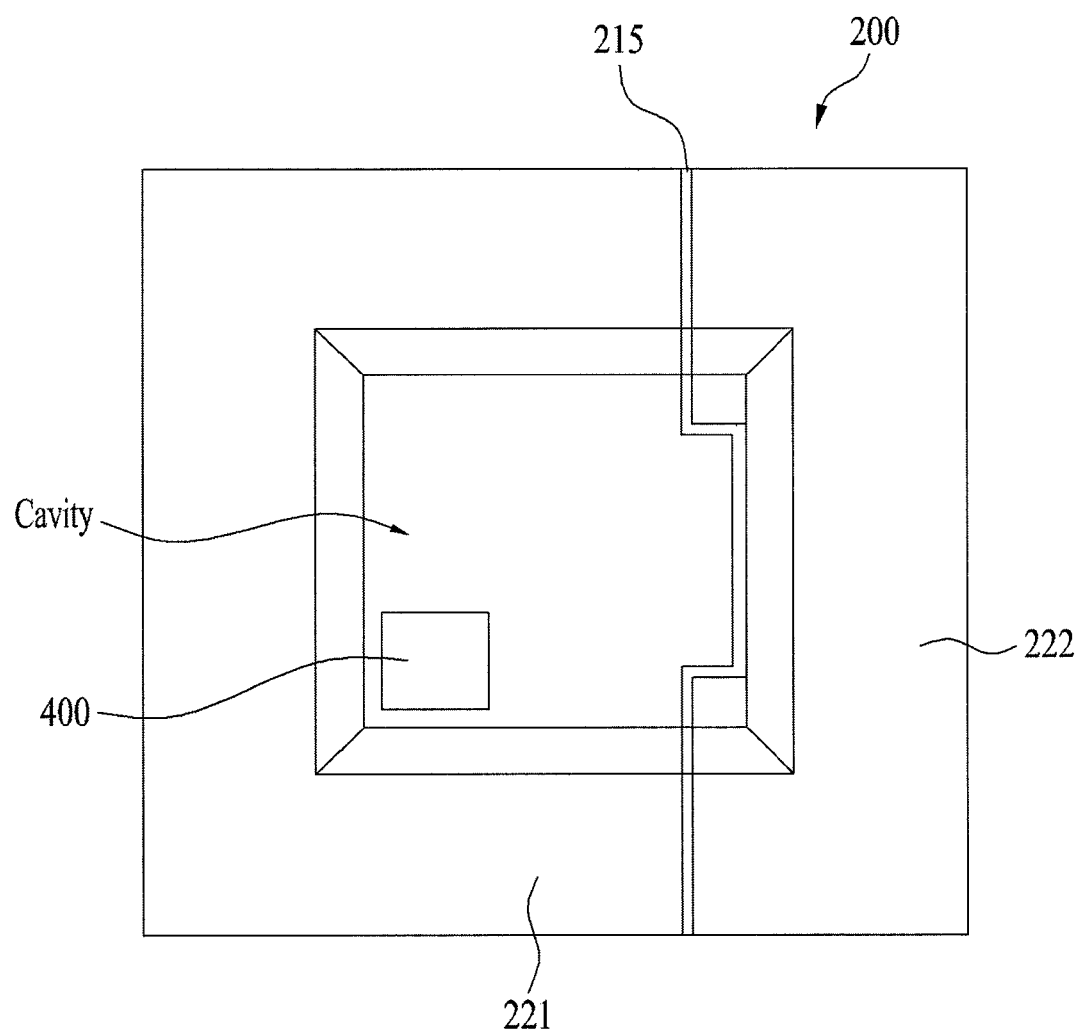

FIGS. 6A and 6B are views illustrating another embodiment of a light emitting device package.

The present embodiment is different from the above-described embodiment in that the thermo sensor 400 is placed at the bottom surface of the cavity, rather than being placed on the raised portion and in that the thermo sensor 400 is disposed after the cavity is etched in the package body fabricated using a silicon wafer, for example.

In the present embodiment, the thermo sensor 400 may be disposed on the bottom surface of the cavity at a position immediately under the light emitting device. Also, since a size of the thermo sensor 400 may be about 1 μm, advantageous heat sensing and only slight light interception may be accomplished even if the thermo sensor 400 is placed on the molding part of the light emitting device package.

In the light emitting device packages according to the above-described embodiments, the thermo sensor in the form of a thin membrane is simply integrated with the package body, and is advantageous with regard to sensing of heat emitted from the light emitting device or heat of the surroundings and enables adjustment in the driving voltage or current of the light emitting device when the sensed result is transmitted to the control circuit.

Figure 7A:
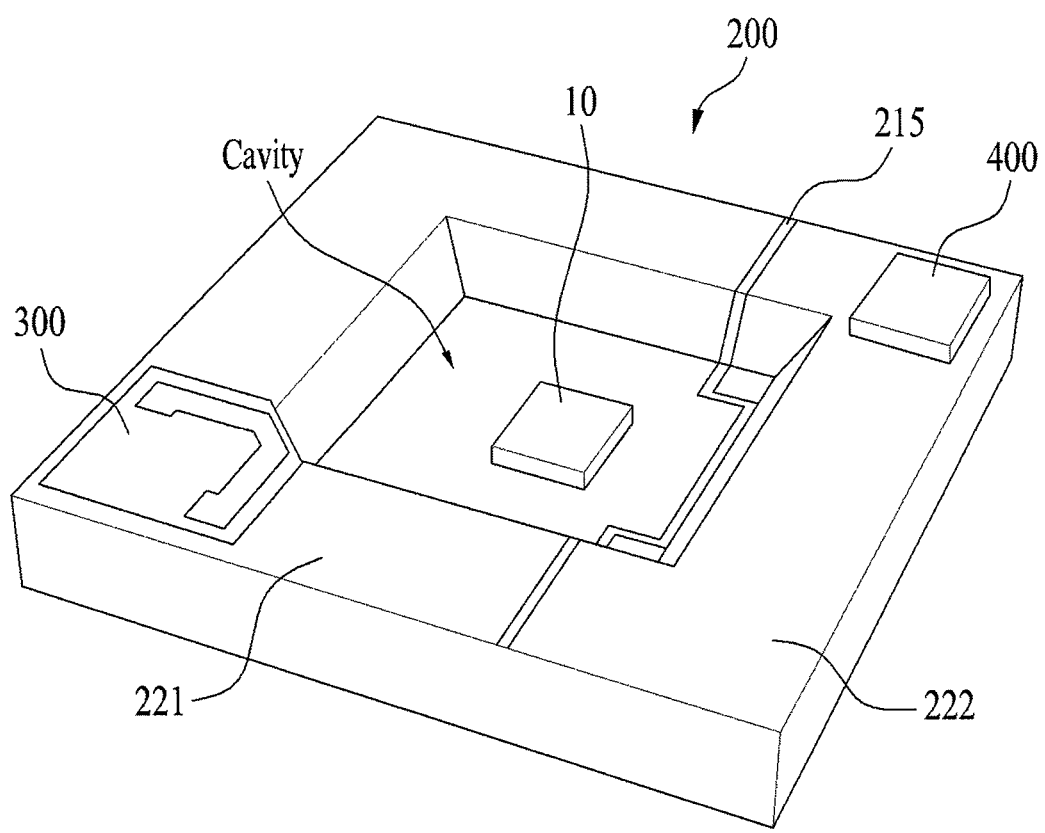
FIGS. 7A to 7D are views illustrating other embodiments of a light emitting device package.
Figure 7B:
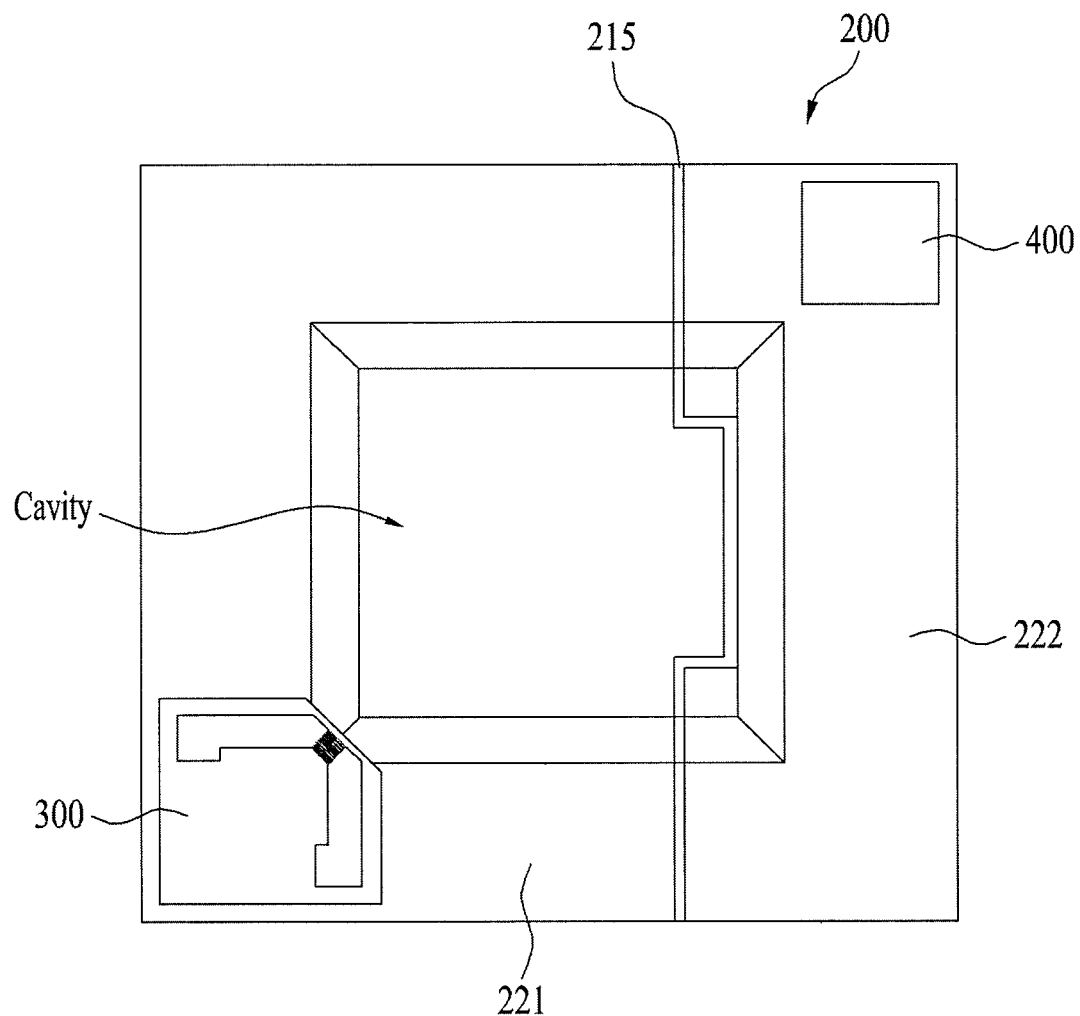
Figure 7C:
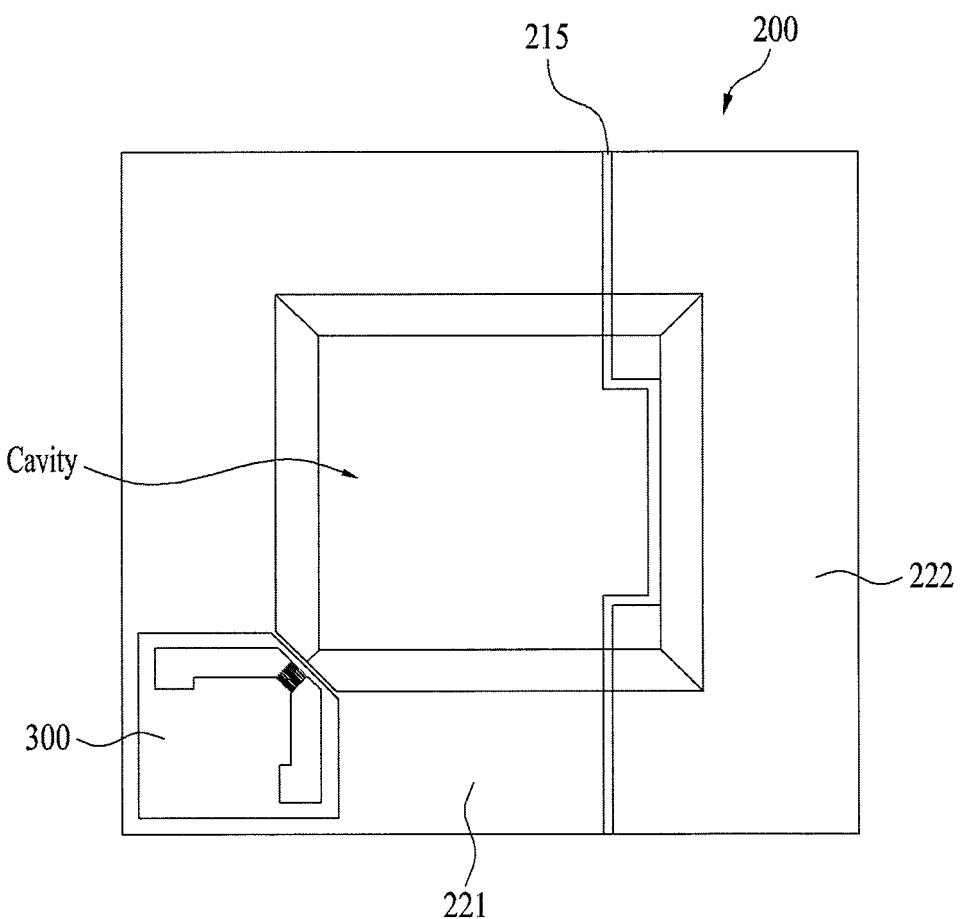
Figure 7D:
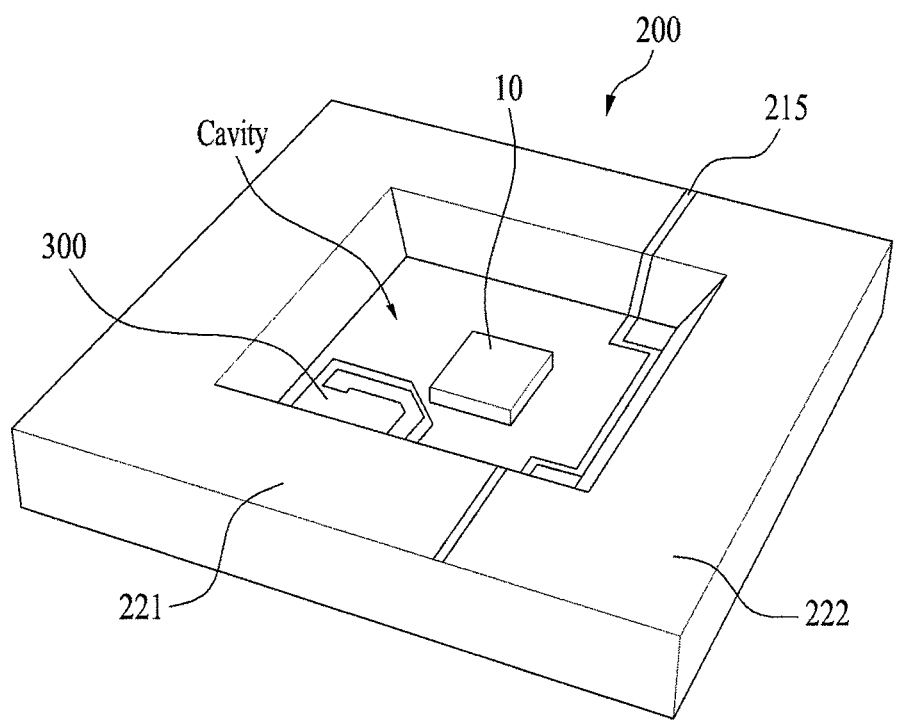
Figure 8A:
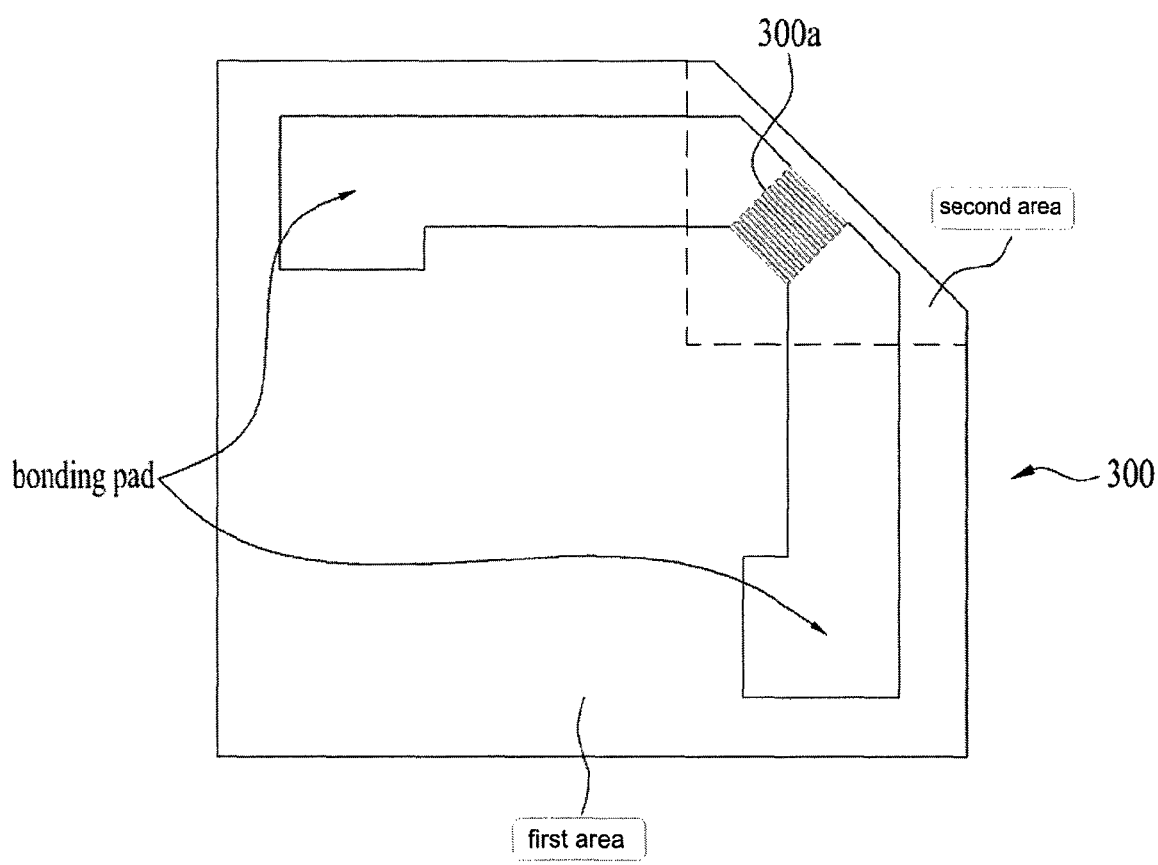
FIGS. 8A and 8B are views illustrating a photo sensor of FIG. 7A in detail.
Figure 8B:
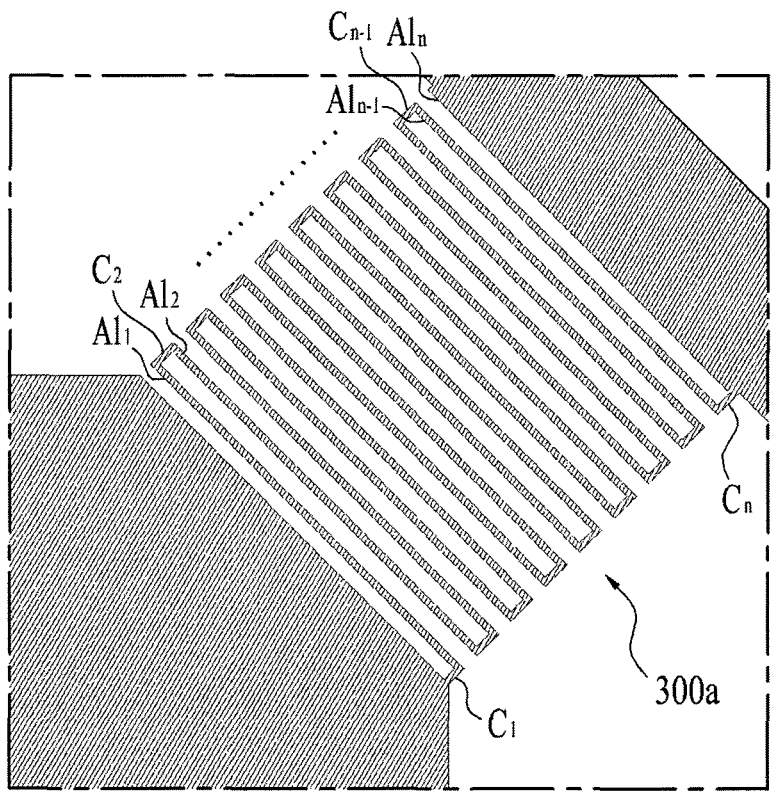

FIGS. 7A to 7D are views illustrating other embodiments of a light emitting device package, FIGS. 8A and 8B are views illustrating a photo sensor of FIG. 7A in detail, and FIGS. 9A to 9D are views illustrating a fabrication process of the photo sensor.

The light emitting device package according to the embodiment illustrated in FIGS. 7A and 7B is different from that of the embodiment illustrated in FIG. 3A in terms of that a photo sensor 300 is placed on the raised portion. The photo sensor 300 is located opposite to the thermo sensor 400 with the light emitting device 10 interposed therebetween.

In the light emitting device package according to the embodiment illustrated in FIG. 7C, the photo sensor 300 is placed on the raised portion, but no thermo sensor is provided.

In the light emitting device package according to the embodiment illustrated in FIG. 7D, differently from the above-described embodiments, the photo sensor 300 is placed at the bottom surface of the cavity, rather than being placed on the raised portion, and the photo sensor 300 is disposed after the cavity is etched in the package body fabricated using a silicon wafer.

In the illustrated embodiment, the photo sensor may be disposed on the bottom surface of the cavity at a position immediately under the light emitting device. In the case of a vertical type light emitting device, a portion of a metal support is removed and a body of the photo sensor is placed in the removed region, which may be advantageous with regarding to light sensing. Also, since a size of the photo sensor may be about 1 μm, advantageous heat sensing and only slight light interception may be accomplished even if the photo sensor is placed on the molding part of the light emitting device package.

The photo sensor 300 may be any one of a photo conductor, a semiconductor junction measurement device, and a metal-semiconductor junction measurement device. The photo sensor 300 may be at least any one of a photo conductor, a PN type photodiode, a PIN type photodiode, an Avalanche photodiode (APD), or a Metal Semiconductor Metal (MSM) type photodiode.

The photo sensor 300, as described above, may be placed on the raised portion of the package body 210. The photo sensor 300 may serve not only to measure the quantity or strength of light emitted from the light emitting device 10, but also to measure the quantity of light of a place where the light emitting device package 200 is located. The photo sensor 300 may be integrated with the package body 210 fabricated using a silicon wafer during a growth process of the package body 210. Specifically, the photo sensor 300 may be located on the above-described raised portion such that a part of the photo sensor 300 is exposed to the cavity so as to sense light emitted from the light emitting device 10.

The photo sensor 300 may be placed on the package body 210 with the insulating layer 215 interposed therebetween. The photo sensor 300 may take the form of a cantilever, a part of which is secured to the raised portion and another part of which is exposed to the cavity. When the photo sensor 300 is partially exposed to the cavity, the quantity of light emitted from the light emitting device 10 may be accurately measured.

The photo sensor 300 may be integrated with the package body. Here, integration means that the photo sensor 300 is disposed during fabrication of the package body, rather than being previously fabricated and then bonded to the package body. The overall size of the photo sensor 300 may be within a range of 50 μm to 150 μm. An excessively small size of the photo sensor 300 may not be sufficient for the line-shaped arrangement of an electrode layer that will be described hereinafter, and an excessively great size of the photo sensor 300 may advantageously improve light sensing via light absorption, but may cause excessive light absorption. Here, the size of the photo sensor 300 refers to the size of each side when the photo sensor 300 has a square shape.

The photo sensor 300 is attached to the package body 210 with the insulating layer 215 interposed therebetween. The photo sensor 300 may include a first insulating film 315, a photo sensor body 330, a second insulating film 335, a light sensing portion 340, and an electrode layer 360.

The first insulating film 315 and the second insulating film 335 may be disposed on first surface and second surface of the photo sensor body 330 opposite to each other, and may be formed of silicon nitride, such as $Si_3N_4$, etc. The first insulating film 315 and the second insulating film 335 may be formed of other insulating materials, such as silicon oxide ($SiO_2$), aluminum nitride (AlN), silicon carbide (SiC), etc. The first insulating film 315 and the second insulating film 335 may be deposited to a thickness of 30 nm to 100 nm, and may have a thickness of 60 nm. An excessively small thickness $t_4$ of the first insulating film 315 and the second insulating film 335 may cause insufficient insulation effects, and an excessively great thickness may cause increased manufacturing cost and unwanted light interception.

The photo sensor body 330 may be formed of a material having excellent light absorption, more particularly, a semiconductor material. Also, the photo sensor body 330 may be formed of a material that exhibits high absorption of a particular wavelength band of light, more particularly, silicon, silicon semiconductors, such as polycrystalline silicon or amorphous silicon, and nitride semiconductors, such as GaN, for example.

A thickness of the photo sensor body 330 may be within a range of 0.5 μm to 5 μm, and may be 1 μm. An excessively small thickness $t_3$ of the photo sensor body 330 may cause insufficient light absorption, and consequently poor operation of the photo sensor 300, and an excessively great thickness may cause a part of light to be absorbed by the photo sensor body 330, which may deteriorate emission of light from the photo sensor 300 of the light emitting device package.

The light sensing portion 340 may be formed of an excellent photo sensitivity material, more particularly, titanium (Ti). The light sensing portion 340 may serve to sense light absorbed by the photo sensor body 330 and transmit the light to the electrode layer 360. The light sensing portion 340 may be electrically connected to the photo sensor body 330 and the electrode layer 360. A thickness of the light sensing portion 340 may be within a range of 25 nm to 100 nm, and may be 50 nm. An excessively small thickness of the light sensing portion 340 may cause insufficient light absorption, and an excessively great thickness may cause increased manufacturing cost or unwanted light interception. Here, the thickness of the light sensing portion 340 may be a thickness t2 of an unpatterned portion or the overall thickness.

The electrode layer 360 may sense current applied to the photo sensor 300, and may be formed of a conductive material. For example, the electrode layer 360 may be formed of a metal or semiconductor material, more particularly aluminum (Al). A thickness of the electrode layer 360 may be 360 nm, and may be within a range of 100 nm to 500 nm. The electrode layer 360 may be deposited. Since an excessively small thickness complicates even deposition, a deposition thickness of 100 nm is sufficient. Conversely, since an excessively great thickness $t_1$ of the electrode layer 360 may cause reflection of light directed to the bottom thereof, a deposition thickness of 500 nm is sufficient. The electrode layer 360 may be deposited along with the first and second electrode layers 221 and 222 placed on the package body, and may be fabricated via the same process as the electrode pad 460 of the thermo sensor 400.

Figure 9A:
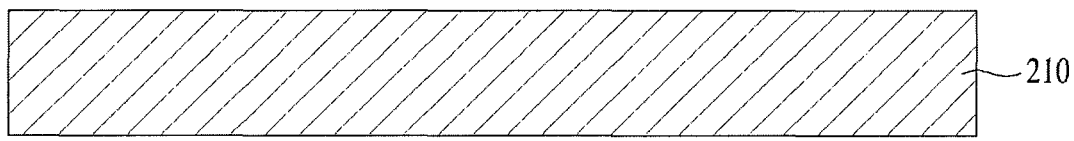
FIGS. 9A to 9D are views illustrating a fabrication process of the photo sensor.
Figure 9B:
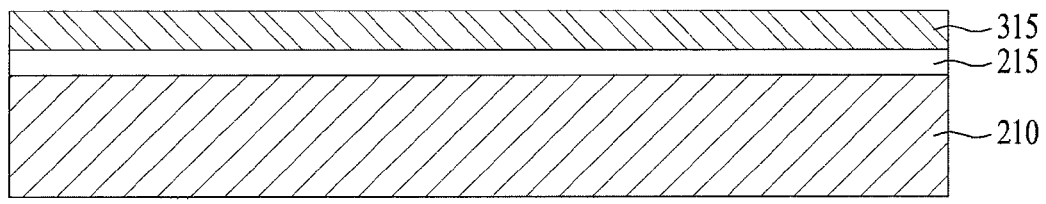
Figure 9C:
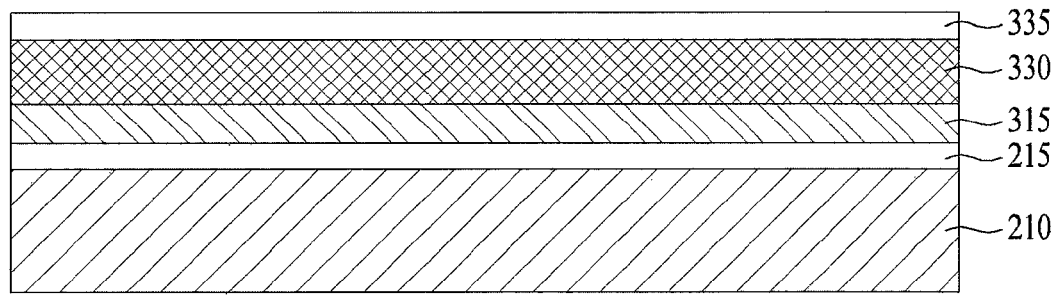
Figure 9D:
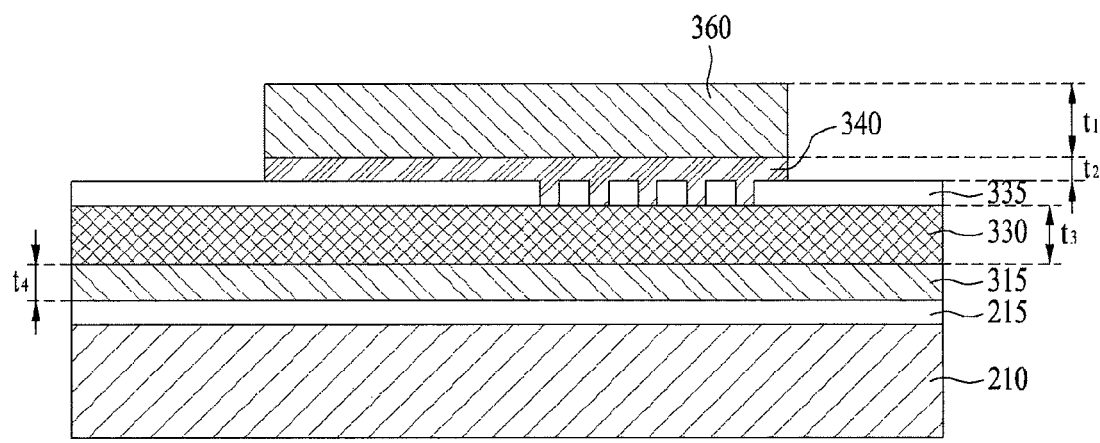

As illustrated in FIG. 9D, the light sensing portion 340 or the second insulating film 335 is patterned such that a part of the light sensing portion 340 is connected to the photo sensor body 330 to allow current to be applied to the light sensing portion 340 in response to light.

The electrode layer 360, as illustrated in FIGS. 8A and 8B, takes the form of an array of a plurality of facing lines, which allows current applied to the light sensing portion 340 to be evenly transmitted to the electrode layer 360. Bonding pads are arranged at both distal ends of the electrode layer 360 in contact with the electrode layer 360. Operation of the photo sensor 300 may be initiated when a voltage is applied to both distal ends of the bonding pads.

FIG. 8B illustrates an active area 300a of the electrode layer 360 in detail. Here, the active area 300a refers to an area to receive current from the light sensing portion 340. In the active area 300a, the electrode layer 360 consists of a plurality of facing lines $Al_1, Al_2, \ldots, Al_{n-1}, Al_n$ and the respective lines $Al_1, Al_2, \ldots, Al_{n-1}, Al_n$ may be connected to one another via a plurality of connectors $C_1, C_2, \ldots, C_{n-1}, C_n$. The plurality of connectors $C_1, C_2, \ldots, C_{n-1}, C_n$ may be alternately located at both ends of the respective lines $Al_1, Al_2, \ldots, Al_{n-1}, Al_n$.

As illustrated in FIG. 8A, the photo sensor 300 includes a first area coming into contact with the package body and a second area facing the bottom of the cavity. The electrode layer is placed in the second area to sense light emitted from the light emitting device.

FIGS. 9A to 9D illustrate a fabrication process of the photo sensor in brief.

In FIG. 9A, the package body 210 is prepared by growth of a p-type silicon wafer. In FIG. 9B, the insulating layer 215 is deposited, and subsequently the first insulating film 315 is deposited by Low Pressure Chemical Vapor Deposition (LPCVD), for example. The insulating layer 215 and the first insulating film 315 may serve as a mask in a following process of etching the silicon wafer. Here, etching of the silicon wafer may be the above-described process of forming the cavity.

In FIG. 9C, the photo sensor body 330 is deposited on the first insulating film 315 using poly silicon, for example, and a second insulating film 335 is disposed as a passivation layer of the photo sensor body 330. In FIG. 9D, the light sensing portion 340 and the electrode layer 360 are deposited and patterned.

In the above-described light emitting device package, the photo sensor in the form of a thin membrane is simply integrated with the package body during fabrication of the package body. The photo sensor may be advantageous with regard to sensing of light emitted from the light emitting device or light of the surroundings.

According to an embodiment, a plurality of light emitting device packages may define an array on a circuit board, and optical members, such as a light guide panel, a prism sheet, and a diffusion sheet, may be arranged on an optical path of the light emitting device packages. The light emitting device packages, the circuit board, and the optical members may function as a light unit. According to another embodiment, a display apparatus, an indicator, or a lighting system including semiconductor devices or light emitting device packages of the above-described embodiments may be realized. For example, a lighting system may include a lamp or a street light. Hereinafter, a head lamp and a backlight unit will be described by way of example of the lighting system including the above-described light emitting device packages.

Figure 10:
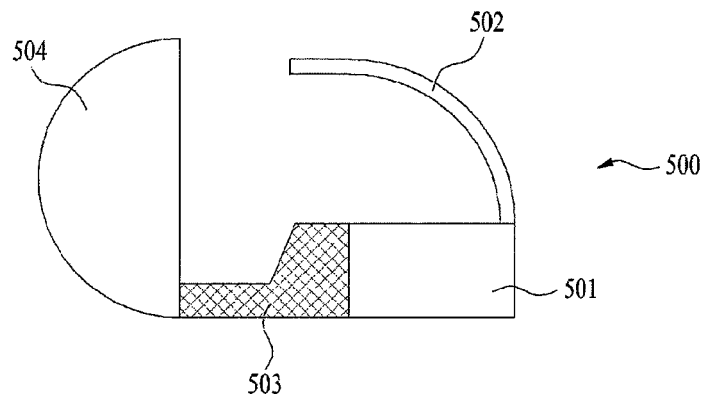
FIG. 10 is a view illustrating an embodiment of a lighting apparatus having light emitting device packages.

FIG. 10 is a view illustrating an embodiment of a head lamp having light emitting device packages.

According to an embodiment, the head lamp 500 may be configured such that light emitted from a light emitting device module 501 including light emitting device packages is reflected by a reflector 502 and a shade 503, and thereafter is directed forward of a vehicle by passing through a lens 504.

As described above, the light emitting device package included in the light emitting device module 501 is provided with the photo sensor in the form of a thin membrane that is simply integrated with the package body during fabrication of the package body, which may ensure advantageous sensing of heat emitted from a light emitting device or the surroundings.

Figure 11:
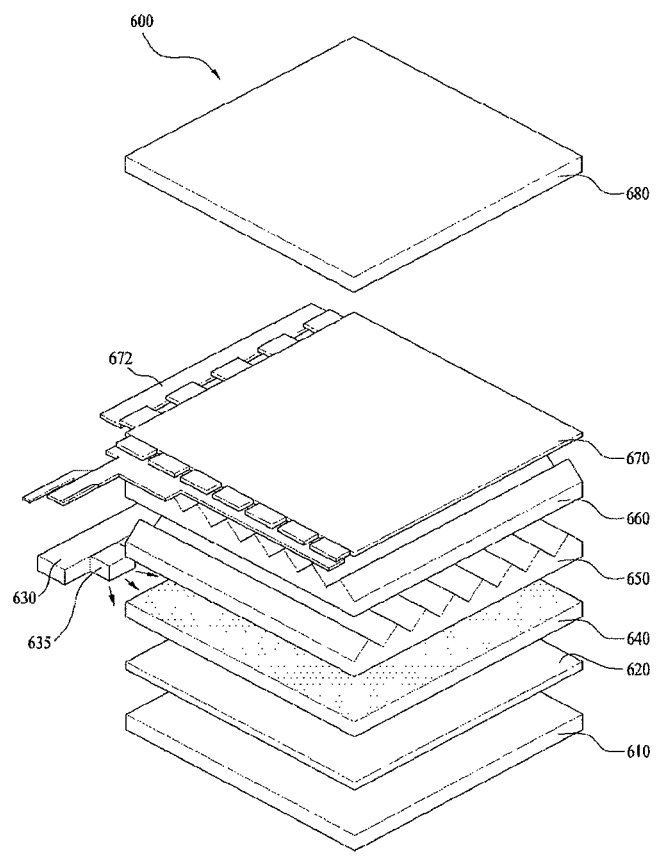
FIG. 11 is a view illustrating an embodiment of an image display apparatus having light emitting device packages.

FIG. 11 is a view illustrating an embodiment of an image display apparatus having light emitting device packages.

As illustrated, the image display apparatus 600 according to the present embodiment includes a light source module, a reflector 620 on a bottom cover 610, a light guide panel 640 placed in front of the reflector 620 to guide light emitted from the light source module in a forward direction of the image display apparatus 600, first and second prism sheets 650 and 660 placed in front of the light guide panel 640, a panel 670 placed in front of the second prism sheet 660, and a color filter 680 placed in front of the panel 670.

The light source module includes a light emitting device package 635 on a circuit board 630. Here, the circuit board 630 may be a Printed Circuit Board (PCB), and the light emitting device package 635 is as described above.

The bottom cover 610 may be configured to receive internal constituent elements of the image display apparatus 600. The reflector 620 may be prepared as a separate component as illustrated in the drawing, or may be a high reflectivity coating material coated on a rear surface of the light guide panel 640 or a front surface of the bottom cover 610.

The reflector 620 may be formed of an ultrathin material that forms an ultrathin layer and has high reflectivity. For example, the reflector 620 may be formed of polyethylene terephtalate (PET).

The light guide panel 640 serves to scatter light emitted from the light emitting device package module to allow the light to be evenly distributed throughout the entire screen of the liquid crystal display apparatus. Accordingly, the light guide panel 640 may be formed of a material having good refractivity and transmittance. For example, the light guide panel 640 may be formed of polymethylmethacrylate (PMMA), polycarbonate (PC), or polyethylene (PE). If the light guide panel 640 is omitted, an air guide type display apparatus may be realized.

The first prism sheet 650 may be disposed on a surface of a support film using a polymer material having light transmittance and elasticity. The polymer material may contain a prism layer in which a plurality of solid patterns is iteratively formed. Here, the plurality of patterns, as illustrated, may include iterative striped ridges and valleys.

In the second prism sheet 660, the direction of ridges and valleys on a surface of a support film may be perpendicular to the direction of ridges and valleys on the surface of the support film in the first prism sheet 650. This serves to evenly distribute light directed from the light source module and the reflector throughout the panel 670.

In the present embodiment, the first prism sheet 650 and the second prism sheet 660 serve as optical sheets. The optical sheets may have another combination, for example, a micro-lens array, a combination of a diffusion sheet and a micro-lens array, or a combination of a single prism sheet and a micro-lens array.

The panel 670 may be a liquid crystal display panel. Instead of the liquid crystal display panel 670, other kinds of display apparatuses that require a light source may be provided.

The panel 670 is constructed in such a way that liquid crystals are interposed between both glass bodies and polarizers are disposed respectively on the glass bodies to realize light polarization. Here, the liquid crystals have intermediate characteristics between liquid and solid. The liquid crystals, which are organic molecules having fluidity similar to liquid, have a regular molecular arrangement. Thus, the liquid crystals serve to display an image as the molecular arrangement thereof varies by an external electric field.

The liquid crystal display panel used in the display apparatus is of an active matrix type and utilizes a transistor as a switch to adjust a voltage applied to each pixel.

The color filter 680 is provided on a front surface of the panel 670 and serves to selectively transmit light having passed through the panel 670 through Red, Green and Blue pixels, enabling display of an image.

As is apparent from the above description, in a light emitting device package for use in an image display apparatus according to the embodiment, a thermo sensor in the form of a thin membrane is simply integrated with a package body during fabrication of the package body, which may be advantages with regard to sensing of heat emitted from a light emitting device or heat of the surroundings.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a package body having a top-opened cavity disposed in at least a portion thereof;
   a first electrode layer electrically isolated from the package body with an insulating layer interposed between the first electrode layer and package body, and a second electrode layer electrically isolated from the package body with the insulating layer interposed between the second electrode layer and package body, the first electrode layer and the second electrode layer being electrically isolated from each other at a bottom surface of the cavity;
   a light emitting device placed on the bottom surface of the cavity configured to emit light through the open region of the cavity; and
   a thermo sensor placed on at least a portion of the package body at the outside of the cavity configured to measure output of the light emitting device,
   wherein a bottom surface of the thermo sensor includes a first area coming into contact with the package body, and a second area facing the bottom surface of the cavity,
   wherein the thermo sensor is located on top of one of the electrode layers,
   wherein the first electrode layer and the second electrode layer are disposed on a side surface of the cavity,
   wherein the second area of the thermo sensor is separated from the side surface of the cavity, and
   wherein an upper surface of the first electrode layer and an upper surface of the second electrode layer are exposed on the side surface of the cavity.

2. The package according to claim 1, wherein the thermo sensor is configured to measure a temperature of the light emitting device.

3. The package according to claim 1, wherein the thermo sensor includes a heat sensing portion and an electrode pad.

4. The package according to claim 3, wherein the heat sensing portion and the electrode pad come into contact with each other with a heat transfer portion interposed therebetween.

5. The package according to claim 3, wherein the heat transfer portion comprises titanium (Ti), and a thickness of the heat transfer portion is within a range of 25 nm to 100 nm.

6. The package according to claim 3, wherein the heat sensing portion comprises nickel (Ni), and a thickness of the heat sensing portion is within a range of 100 nm to 500 nm.

7. The package according to claim 3, wherein the electrode pad comprises aluminum (Al), and a thickness of the electrode pad is within a range of 100 nm to 500 nm.

8. The package according to claim 1, wherein a size of the thermo sensor is within a range of 0.3 μm to 1 μm.

9. The package according to claim 1, wherein the thermo sensor is fabricated by a growth process which integrates the thermo sensor with the package body.

10. The package according to claim 1, wherein the cavity is at least a partial depressed portion of the package body, the package body includes a raised portion around the open region of the cavity, and the thermo sensor is placed on the raised portion.

11. The package according to claim 1, wherein the cavity has one of a polygonal, circular, or oval cross section.

12. The package according to claim 1, wherein the area of the top of the cavity is greater than the area of the bottom surface.

13. The package according to claim 1, wherein the insulating layer includes at least one of silicon oxide ($SiO_2$), silicon nitride ($Si_3N_4$), aluminum nitride (AlN), or silicon carbide (SiC).

14. A light emitting device package comprising:
   a package body having a top-opened cavity disposed in at least a portion thereof;
   a first electrode layer electrically isolated from the package body with an insulating layer interposed between the first electrode layer and package body, and a second electrode layer electrically isolated from the package body with the insulating layer interposed between the second electrode layer and package body, the first electrode layer and the second electrode layer being electrically isolated from each other at a bottom surface of the cavity;
   a light emitting device placed on the bottom surface of the cavity configured to emit light through the open region of the cavity; and
   a thermo sensor placed on at least a portion of the package body at the outside of the cavity configured to measure output of the light emitting device,
   wherein the cavity is at least a partial depressed portion of the package body, the package body includes a raised portion around the open region of the cavity, and the thermo sensor is placed on the raised portion,
   wherein a bottom surface of the thermo sensor includes a first area coming into contact with the package body, and a second area facing the bottom surface of the cavity,
   wherein the thermo sensor is located on top of one of the electrode layers,
   wherein the first electrode layer and the second electrode layer are disposed on a side surface of the cavity,
   wherein the second area of the thermo sensor is separated from the side surface of the cavity, and
   wherein an upper surface of the first electrode layer and an upper surface of the second electrode layer are exposed on the side surface of the cavity.

15. The package according to claim 14, wherein the thermo sensor includes a heat sensing portion and an electrode pad.

16. The package according to claim 15, wherein the heat sensing portion and the electrode pad come into contact with each other with a heat transfer portion interposed therebetween.

17. The package according to claim 14, wherein the area of the top of the cavity is greater than the area of the bottom surface.

18. The package according to claim 14, wherein the thermo sensor is fabricated by a growth process which integrates the thereto sensor with the package body.

19. A light emitting device package comprising:
a package body having a top-opened cavity disposed in at least a portion thereof;
a first electrode layer electrically isolated from the package body with an insulating layer interposed between the first electrode layer and package body, and a second electrode layer electrically isolated from the package body with the insulating layer interposed between the second electrode layer and package body, the first electrode layer and the second electrode layer being electrically isolated from each other at a bottom surface of the cavity;
a light emitting device placed on the bottom surface of the cavity configured to emit light through the open region of the cavity; and
a thermo sensor placed on at least a portion of the package body at the outside of the cavity configured to measure output of the light emitting device, the thermo sensor fabricated by a growth process which integrates the thermo sensor with the package body,
wherein the cavity is at least a partial depressed portion of the package body, the package body includes a raised portion around the open region of the cavity, and the thermo sensor is placed on the raised portion,
wherein the area of the top of the cavity is greater than the area of the bottom surface,
wherein a bottom surface of the thermo sensor includes a first area coming into contact with the package body, and a second area facing the bottom surface of the cavity,
wherein the thermo sensor is located on top of one of the electrode layers,
wherein the first electrode layer and the second electrode layer are disposed on a side surface of the cavity,
wherein the second area of the thermo sensor is separated from the side surface of the cavity, and
wherein an upper surface of the first electrode layer and an upper surface of the second electrode layer are exposed on the side surface of the cavity.

* * * * *